(12) United States Patent
Huang et al.

(10) Patent No.: US 10,884,025 B2
(45) Date of Patent: Jan. 5, 2021

(54) TESTING DEVICE HAVING A DETACHABLE NEEDLE HOLDER

(71) Applicant: TRIPLE WIN TECHNOLOGY(SHENZHEN) CO. LTD., Shenzhen (CN)

(72) Inventors: Chun-Yao Huang, New Taipei (TW); Cheng-An Lin, New Taipei (TW)

(73) Assignee: TRIPLE WIN TECHNOLOGY(SHENZHEN) CO. LTD., Shenzhen (CN)

(*) Notice: Subject to any disclaimer, the term of this patent is extended or adjusted under 35 U.S.C. 154(b) by 101 days.

(21) Appl. No.: 16/234,899

(22) Filed: Dec. 28, 2018

(65) Prior Publication Data

US 2020/0132723 A1 Apr. 30, 2020

(30) Foreign Application Priority Data

Oct. 29, 2018 (CN) .......................... 2018 1 1271560

(51) Int. Cl.
*G01R 31/00* (2006.01)
*G01R 1/073* (2006.01)

(52) U.S. Cl.
CPC ................................ *G01R 1/07307* (2013.01)

(58) Field of Classification Search
CPC ............... G01R 1/0433; G01R 1/0466; G01R 1/07307; G01R 31/2886; H01R 12/85; H01R 12/716
See application file for complete search history.

(56) References Cited

U.S. PATENT DOCUMENTS

| | | | | |
|---|---|---|---|---|
| 5,990,692 A | * | 11/1999 | Jeong | G01R 31/2886 324/754.08 |
| 6,720,783 B2 | * | 4/2004 | Satoh | G01R 1/0433 324/754.08 |
| 2002/0137365 A1 | * | 9/2002 | McGrath | H05K 7/1069 439/71 |
| 2017/0315149 A1 | | 11/2017 | Chen et al. | |

FOREIGN PATENT DOCUMENTS

| CN | 207067339 | 3/2018 |
|---|---|---|
| TW | I596344 | 8/2017 |

OTHER PUBLICATIONS

CN 207067339 Translation.*

* cited by examiner

*Primary Examiner* — Minh N Tang
(74) *Attorney, Agent, or Firm* — ScienBiziP, P.C.

(57) ABSTRACT

A testing device with enhanced accessibility for repair and replacement purposes includes a base, an upper seat, a test board and a needle seat. The upper seat is mounted on the base. The test board is sandwiched between the base and the upper seat. A receiving groove is defined on the upper seat. The receiving groove extends through the upper seat to partially expose the test board. The needle seat is detachably fixed to the upper seat. A lower part of the needle seat is received in the receiving groove and abuts against the test board. An upper portion of the needle seat protrudes from the upper seat and is configure for connecting connection terminals of a product to be tested.

5 Claims, 4 Drawing Sheets

TESTING DEVICE HAVING A DETACHABLE NEEDLE HOLDER

FIELD

The subject matter herein generally relates to a testing device.

BACKGROUND

When computers, communication devices, or consumer electronics product is tested, connection terminals of the product are plugged into a testing device. The product and a test board of the testing device are connected by means of a socket, and the testing device is operated by simulating the whole machine. During testing, the connection terminals of the product can be inserted into the needle holder of the testing device to achieve fast and effective testing.

In order to facilitate the testing, the existing automatic testing device adopts a mounting method of directly fixing the needle holder between the upper seat and the test board of the testing device, and the top end portion of the needle holder is pierced and protrudes from the upper seat. However, this type of mounting is not conducive to the repair and replacement of the needle holder. Specifically, if the needle holder is damaged and needs to be repaired, the testing device needs to be completely disassembled to repair or replace the needle holder, and the automatic testing device will need to be recalibrated and reconfirmed.

Therefore, there is room for improvement within the art.

BRIEF DESCRIPTION OF THE DRAWINGS

Implementations of the present technology will now be described, by way of embodiments, with reference to the attached figures.

DETAILED DESCRIPTION

Figure 1:
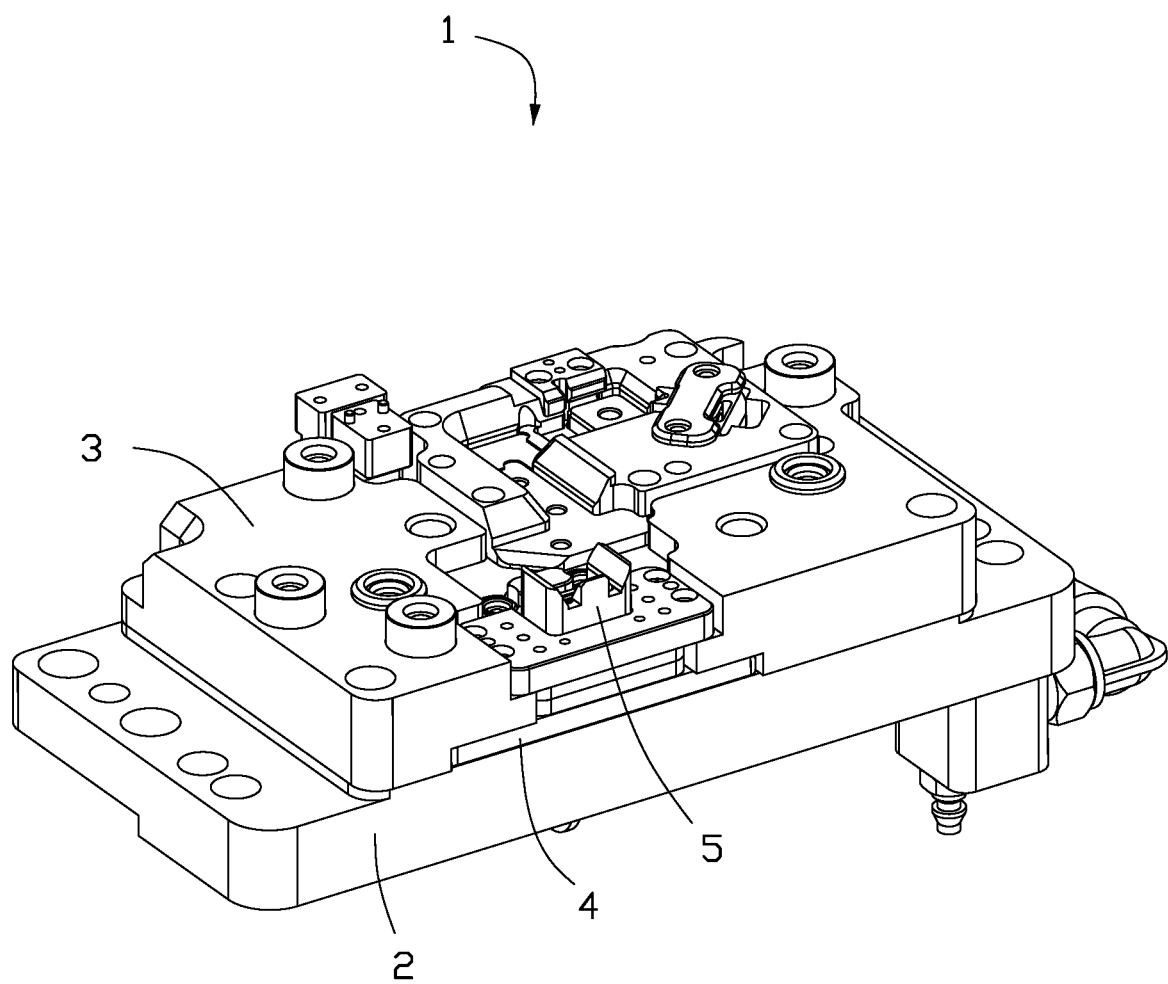
FIG. 1 is an assembled, isometric view of a testing device in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Figure 2:
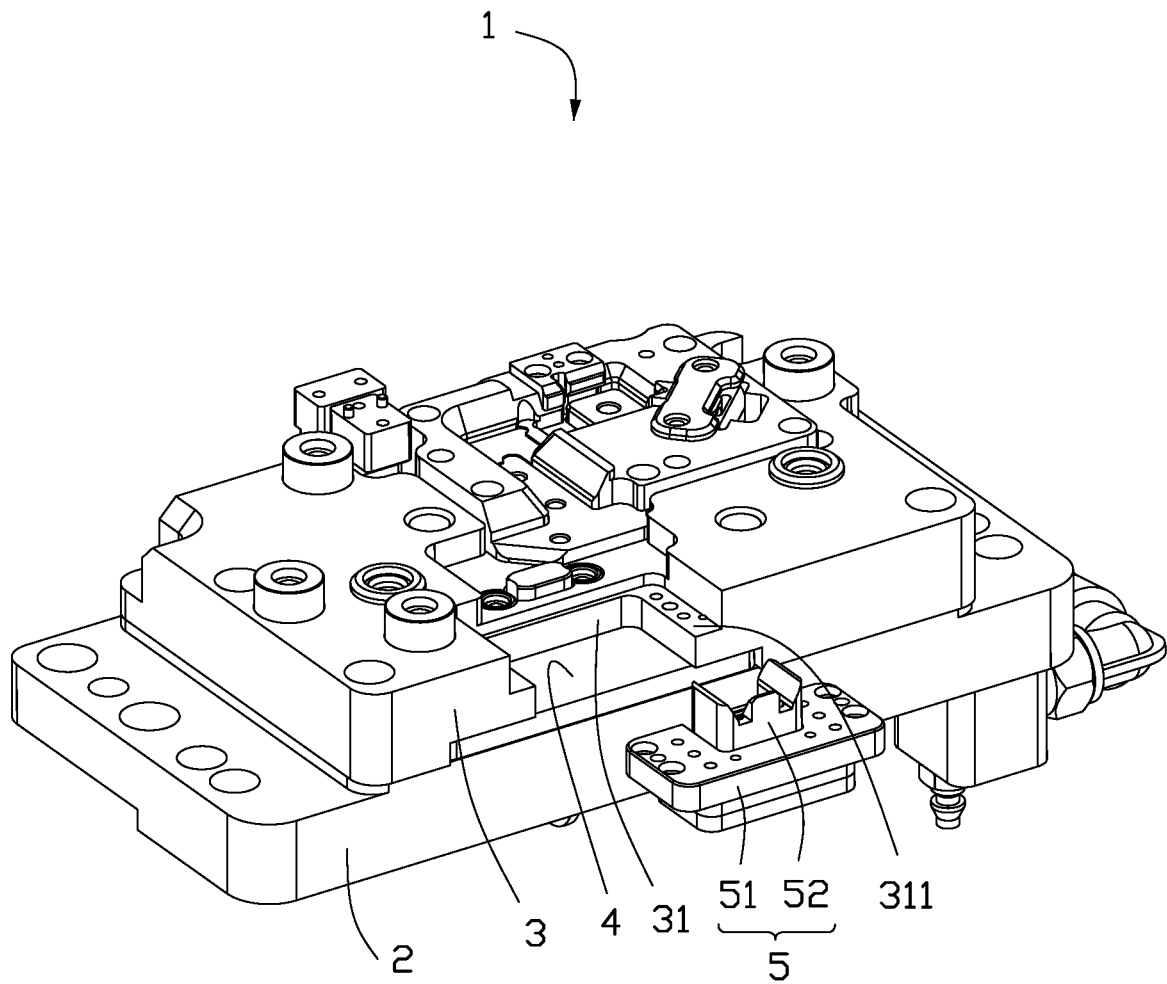
FIG. 2 is an isometric view of part of the testing device shown in FIG. 1.

Referring to FIG. 1 and FIG. 2, a testing device 1 an embodiment at least includes a base 2, an upper seat 3, a test board 4, and a needle holder 5. The upper seat 3 is mounted on the base 2. The test board 4 is sandwiched between the base 2 and the upper seat 3. A receiving groove 31 is defined on the upper seat 3. The receiving groove 31 extends through the upper seat 3 to partially expose the test board 4. The needle holder 5 is detachably fixed to the upper seat 3. A lower part of the needle holder 5 is completely received in the receiving groove 31 and abuts against the test board 4. An upper portion of the needle holder 5 protrudes from the upper seat 3 to connect to connection terminals of a product to be tested (not shown).

It can be understood that the base 2 and the upper seat 3 are further provided with other necessary structures for supporting the test board 4 to complete the testing work.

The receiving groove 31 is stepped, and the needle holder 5 is fixed to a ladder surface 311 in the receiving groove 31 and abuts against the test board 4.

Preferably, the receiving groove 31 is substantially U-shaped, and is a concavity between the adjacent side surfaces of the upper seat 3. The receiving groove 31 penetrates the upper seat 3 to facilitate the disassembly of the needle holder 5. It can be understood that the receiving groove 31 can also be a through hole penetrating the upper seat 3.

The needle holder 5 includes a fixing seat 51 and a needle assembly 52. The needle assembly 52 is fixed to the upper seat 3 by the fixing seat 51. Specifically, the fixing seat 51 is fixed on the ladder surface 311 in the receiving groove 31. The needle assembly 52 is inserted into the fixing seat 51. The middle and lower portions of the needle assembly 52 are completely received in the receiving groove 31. The upper portion of the needle assembly 52 protrudes from the upper seat 3 to connect to connection terminals of the product to be tested (not shown).

Figure 3:
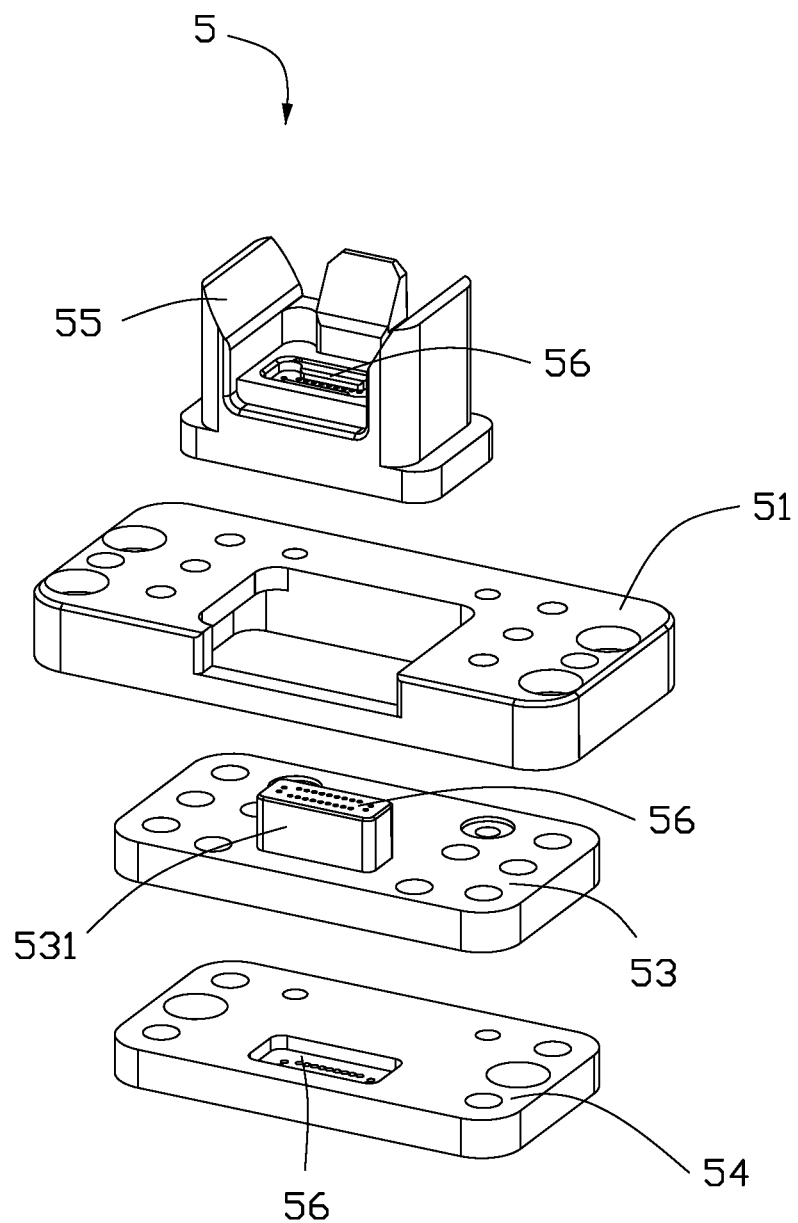
FIG. 3 is an isometric view of a needle seat of the testing device shown in FIG. 2.
Figure 4:
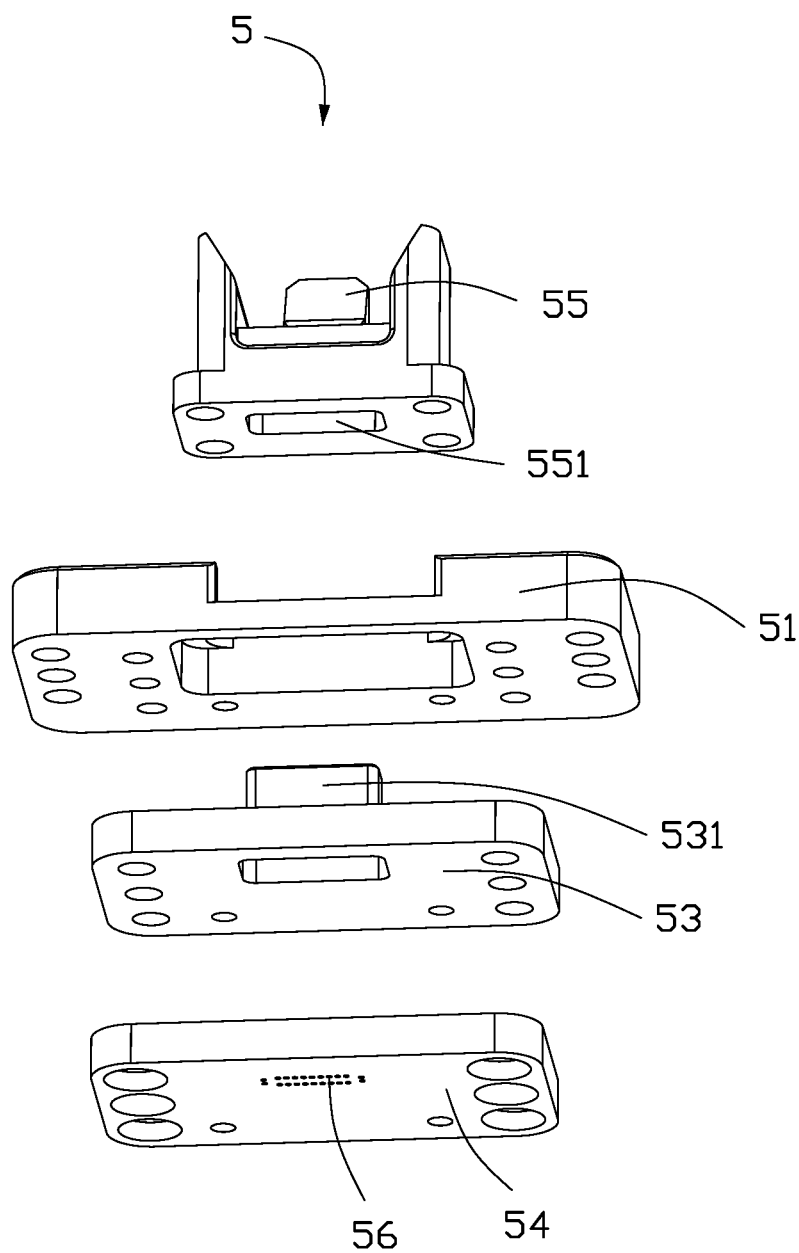
FIG. 4 is an isometric view of a needle seat shown in FIG. 3, from another angle.

Referring to FIG. 3 and FIG. 4, in an embodiment, the needle assembly 52 includes a fixing member 53, an abutting member 54, and a protruding member 55. The fixing member 53 is fixed to a lower side of the fixing seat 51. The protruding member 55 and the abutting member 54 are mounted on opposite sides of the fixing member 53. The protruding member 55 is located on an upper side of the fixing seat 51, and the abutting member 54 is located on the test board 4.

Specifically, an upper side of the fixing member 53 is provided with a protruding positioning block 531, and a lower side of the protruding member 55 has a positioning groove 551 as a concavity. The positioning block 531 protrudes through the fixing seat 51 and is received in the positioning groove 551.

The protruding member 55, the fixing member 53, and the abutting member 54 are each provided with through holes 56. The through holes 56 of the fixing member 53 and the through holes 56 of the abutting member 54 are correspondingly positioned to the through holes 56 of the protruding member 55. The through holes 56 are used to pierce probes (not shown).

The testing device 1 utilizes the structure of the upper seat 3 and the needle holder 5 to mount the needle holder 5 to the receiving groove 31 of the upper seat 3. The testing device 1 can repair or replace the needle holder 5 without disassembling other structures.

In addition, the testing device 1 utilizes the structure of the needle holder 5, the needle assembly 52 is mounted in the receiving groove 31 of the upper seat 3 by the fixing seat 51. Therefore, more convenient installation and disassembly are achieved.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A testing device, comprising:
    a base;
    an upper seat mounted on the base, wherein a receiving groove is defined on the upper seat;
    a test board sandwiched between the base and the upper seat; and
    a needle holder detachably fixed to the upper seat;
    wherein the receiving groove extends through the upper seat to partially expose the test board, a lower part of the needle holder is received in the receiving groove and abuts against the test board, and an upper portion of the needle holder protrudes from the upper seat and is configured for connecting connection terminals of a product to be tested; the needle holder comprises a fixing seat and a needle assembly, the needle assembly is fixed to the upper seat by the fixing seat, the needle assembly comprises a fixing member, an abutting member, and a protruding member; the fixing member is fixed to a lower side of the fixing seat, the protruding member and the abutting member are mounted on opposite sides of the fixing member, the protruding member is located on an upper side of the fixing seat, and the abutting member is located on the test board.

2. The testing device of claim 1, wherein the receiving groove is U-shaped, and is a concavity between adjacent side surfaces of the upper seat, the receiving groove penetrates the upper seat.

3. The testing device of claim 1, wherein the receiving groove is stepped, and the fixing seat is fixed to a ladder surface in the receiving groove.

4. The testing device of claim 3, wherein an upper side of the fixing member comprises a protruding positioning block, and a lower side of the protruding member has a positioning groove as a concavity, the positioning block protrudes through the fixing seat and is received in the positioning groove.

5. The testing device of claim 3, wherein each of the protruding member, the fixing member, and the abutting member comprises through holes, the through holes of the fixing member and the through holes of the abutting member are correspondingly positioned to the through holes of the protruding member.

* * * * *